(12) United States Patent
Matsukura et al.

(10) Patent No.: US 12,009,457 B2
(45) Date of Patent: Jun. 11, 2024

(54) NITRIDE SEMICONDUCTOR LIGHT-EMITTING ELEMENT

(71) Applicant: NIKKISO CO., LTD., Tokyo (JP)

(72) Inventors: Yusuke Matsukura, Ishikawa (JP); Cyril Pernot, Ishikawa (JP)

(73) Assignee: Nikkiso Co., Ltd., Tokyo (JP)

(*) Notice: Subject to any disclaimer, the term of this patent is extended or adjusted under 35 U.S.C. 154(b) by 153 days.

(21) Appl. No.: 17/502,161

(22) Filed: Oct. 15, 2021

(65) Prior Publication Data

US 2022/0123174 A1 Apr. 21, 2022

(30) Foreign Application Priority Data

Oct. 16, 2020 (JP) .................................. 2020-175018

(51) Int. Cl.
*H01L 33/32* (2010.01)
*H01L 33/04* (2010.01)

(52) U.S. Cl.
CPC .............. *H01L 33/32* (2013.01); *H01L 33/04* (2013.01)

(58) Field of Classification Search
CPC ................................ H01L 33/32; H01L 33/05
See application file for complete search history.

(56) References Cited

U.S. PATENT DOCUMENTS

| | | | |
|---|---|---|---|
| 10,944,026 B2 | 3/2021 | Matsukura et al. | |
| 2011/0309327 A1* | 12/2011 | Jeong | H01L 33/32 257/13 |
| 2015/0171263 A1* | 6/2015 | Nakatsu | H01L 33/32 438/47 |
| 2016/0087146 A1* | 3/2016 | Yamane | H01L 33/025 257/13 |
| 2017/0186912 A1* | 6/2017 | Inoue | H01L 33/42 |
| 2019/0355872 A1 | 11/2019 | Matsukura et al. | |
| 2021/0066548 A1 | 3/2021 | Wada et al. | |

FOREIGN PATENT DOCUMENTS

| | | |
|---|---|---|
| CN | 111527612 A | 8/2020 |
| JP | H11-145515 A | 5/1999 |
| JP | 2018-125428 A | 8/2018 |
| JP | 2019121654 A | 7/2019 |

(Continued)

OTHER PUBLICATIONS

Official Action and Search Report dated Jan. 16, 2023 received from the Taiwanese Patent Office in related 110137705 together with English language translation.

(Continued)

*Primary Examiner* — Mark W Tornow
(74) *Attorney, Agent, or Firm* — Scully, Scott, Murphy & Presser, PC (57) ABSTRACT

A nitride semiconductor light-emitting element outputs ultraviolet light. The nitride semiconductor light-emitting element includes an active layer including a quantum well structure that generates the ultraviolet light, a dislocation suppression structure-containing layer being formed on the active layer and including a dislocation suppression structure that stops or bends a dislocation from the active layer; and a p-type contact layer being formed on the dislocation suppression structure-containing layer and having a thickness of not less than 10 nm and not more than 30 nm.

10 Claims, 8 Drawing Sheets

(56) References Cited

FOREIGN PATENT DOCUMENTS

| JP | 2020-75842 | A | 5/2020 |
|---|---|---|---|
| KR | 10-2012-0095652 | A | 8/2012 |
| TW | 200903833 | A | 1/2009 |
| TW | 201931621 | A | 8/2019 |

OTHER PUBLICATIONS

Office Action dated Jun. 28, 2022 from related JP 2020-175018 dated Jun. 28, 2022 together with English language translation.
Notification of First Office Action dated Apr. 2, 2024 received from the China National Intellectual Property Administration in related application CN 202111196489.0.

* cited by examiner

|  | INITIAL LIGHT OUTPUT (mW@350mA) | RESIDUAL LIGHT OUTPUT AFTER ENERGIZATION (@350mA) |
|---|---|---|
| EXAMPLE | 125.1 | 94.6% |
| FIRST COMPARATIVE EXAMPLE | 85.2 | 92.9% |
| SECOND COMPARATIVE EXAMPLE | 104.3 | 76.2% |

NITRIDE SEMICONDUCTOR LIGHT-EMITTING ELEMENT

CROSS-REFERENCE TO RELATED APPLICATION

The present application is based on Japanese Patent Application No. 2020-175018 filed on Oct. 16, 2020, the entire contents of which are incorporated herein by reference.

BACKGROUND OF THE INVENTION

1. Field of the Invention

The invention relates to a nitride semiconductor light-emitting element.

2. Related Art

In recent years, nitride semiconductor light-emitting elements such as light-emitting diodes or laser diodes which emit ultraviolet light have been available, and nitride semiconductor light-emitting elements with improved light output have been under development (see JP 2019/121654 A).

The nitride semiconductor light-emitting element described in JP 2019/121654 A includes a substrate, a buffer layer formed on the substrate, an n-type cladding layer formed on the buffer layer, an active layer that is formed on the n-type cladding layer and includes a multiple quantum well structure, a multilayered semiconductor layer formed on the active layer, a p-side electrode formed on the multilayered semiconductor layer, and an n-side electrode formed on a certain region of the n-type cladding layer. The multilayered semiconductor layer includes an electron blocking layer, a p-type cladding layer formed on the electron blocking layer, and a p-type contact layer formed on the p-type cladding layer.

In this nitride semiconductor light-emitting element, a thickness of the p-type contact layer is as small as, e.g., 10 nm and it is thereby possible to improve light output.

However, the conventional nitride semiconductor light-emitting element described above has a problem that dislocations (dislocation lines) from the active layer reach the p-type contact layer (particularly, a surface of the p-type contact layer). When such dislocations extending from the p-type contact layer to the active layer occur, current concentration occurs at such dislocation sites and metal elements of the p-side electrode get into the active layer through the dislocation sites. Thus, light output of the nitride semiconductor light-emitting element is likely to decrease over time with energization time.

THE SUMMARY OF THE INVENTION

Therefore, it is an object of the invention to provide a nitride semiconductor light-emitting element of which light output can be improved and a decrease in light output over time can be suppressed.

To achieve the object described above, the invention provides a nitride semiconductor light-emitting element that outputs ultraviolet light, the nitride semiconductor light-emitting element comprising:

an active layer comprising a quantum well structure that generates the ultraviolet light;

a dislocation suppression structure-containing layer being formed on the active layer and comprising a dislocation suppression structure that stops or bends a dislocation from the active layer; and a p-type contact layer being formed on the dislocation suppression structure-containing layer and having a thickness of not less than 10 nm and not more than 30 nm. Note that, "upper/on" here indicates a relative position of one object to another object and is a concept including not only a state in which the one object is directly arranged on the other object without any third object in-between, but also a state in which the one object is arranged on the other object with a third object in-between.

Effects of the Invention

According to the present invention, it is possible to provide a nitride semiconductor light-emitting element of which light output can be improved and a decrease in light output over time can be suppressed.

BRIEF DESCRIPTION OF THE DRAWINGS

Next, the present invention will be explained in more detail in conjunction with appended drawings, wherein.

DESCRIPTION OF THE PREFERRED EMBODIMENTS

Embodiment

An embodiment of the invention will be described in reference to the drawings. The embodiment below is described as a preferred specific example for implementing the invention. Although some part of the embodiment specifically illustrates various technically preferable matters, the technical scope of the invention is not limited to such specific aspects. In addition, a scale ratio of each constituent element in each drawing is not necessarily the same as the actual scale ratio of the nitride semiconductor light-emitting element. In the description of the invention below, a direction of stacking each layer of the nitride semiconductor light-emitting element is simply referred to as a "stacking direction", and the nitride semiconductor light-emitting element is simply referred to as a "light-emitting element". In addition, in the description below, "upper/on" indicates a relative position of one object to another object and includes not only a state in which the one object is directly arranged on the other object without any third object in-between, but also a state in which the one object is arranged on the other object with a third object in-between.

Figure 1:
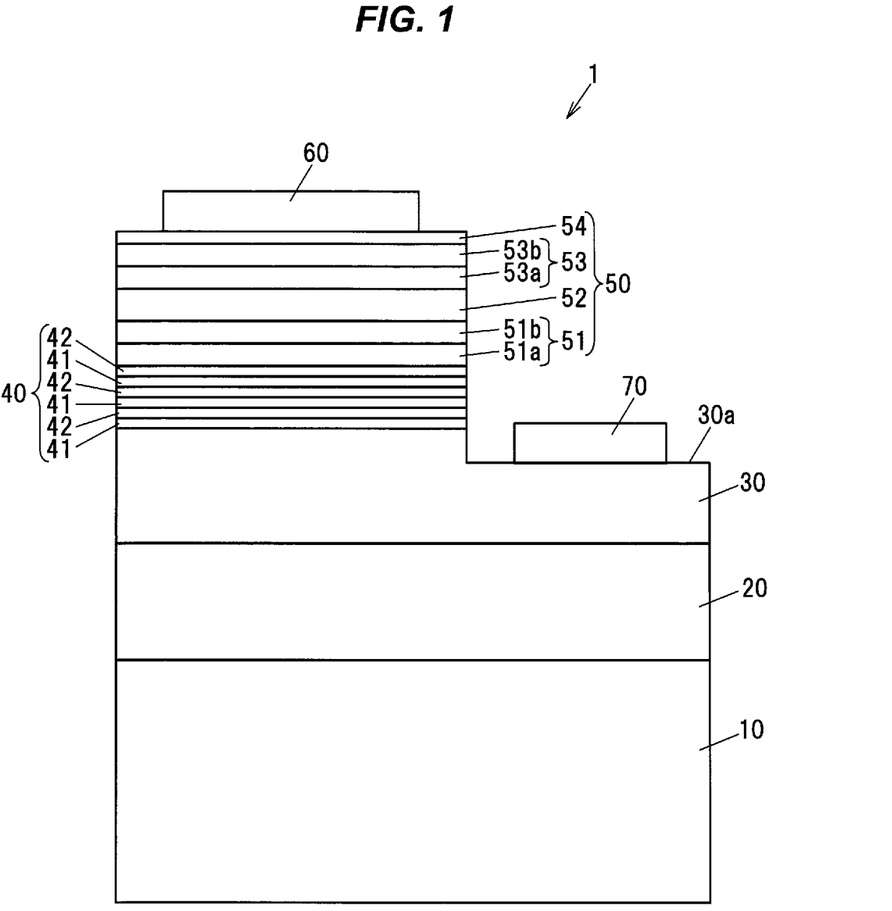
FIG. 1 is a schematic cross-sectional view showing an example configuration of a light-emitting element in an embodiment of the present invention.

FIG. 1 is a schematic cross-sectional view showing an example configuration of a light-emitting element 1 in an embodiment of the invention. The light-emitting element 1 includes, e.g., laser diode or light-emitting diode (LED). In the present embodiment, a light-emitting diode (LED) which outputs ultraviolet light at a central wavelength of 200 nm to 365 nm (so-called deep ultraviolet light) will be described as an example of the light-emitting element 1.

As shown in FIG. 1, the light-emitting element 1 has a substrate 10, a buffer layer 20 formed on the substrate 10, an n-type cladding layer 30 formed on the buffer layer 20, an active layer 40 that is formed on the n-type cladding layer 30 and includes a multiple quantum well structure generating ultraviolet light, a multilayered semiconductor layer 50 formed on the active layer 40, a p-side electrode 60 formed on the multilayered semiconductor layer 50, and an n-side electrode 70 formed on a certain region of the n-type cladding layer 30.

As the semiconductor constituting the light-emitting element 1, it is possible to use, e.g., a binary or ternary group III nitride semiconductor which is expressed by $Al_xGa_{1-x}N$ (0≤x≤1). Nitrogen (N) may be partially substituted with phosphorus (P), arsenic (As), antimony (Sb) or bismuth (Bi), etc.

The substrate 10 is a sapphire substrate including a sapphire ($Al_2O_3$) single crystal. As the substrate 10, e.g., an aluminum nitride (AlN) substrate or an aluminum gallium nitride (AlGaN) substrate may be used instead of the sapphire substrate.

The buffer layer 20 is made of aluminum nitride. When the substrate 10 is an AlN substrate or an AlGaN substrate, the buffer layer 20 may not be necessarily included.

As the n-type cladding layer 30, it is possible to use a layer which is made of AlGaN with n-type conductivity (hereinafter, also simply referred to as "n-type AlGaN") and is an $Al_pGa_{1-p}N$ (0<p≤1) layer doped with silicon (Si) as an n-type impurity. In present embodiment, a dopant concentration (an Si concentration) in the n-type cladding layer 30 is not less than $0.5\times10^{19}$ [atoms/cm³] and not more than $2.5\times10^{19}$ [atoms/cm³]. An Al composition ratio of n-type AlGaN constituting the n-type cladding layer 30 is not less than 50% and not more than 60% (0.5≤p≤0.6) and is higher than an Al composition ratio of a well layer 42 (p>r). The Al composition ratio of AlGaN constituting the n-type cladding layer 30 is preferably as small as possible in a range larger than the Al composition ratio of the well layer 42. As the n-type impurity to dope the n-type cladding layer 30, germanium (Ge), selenium (Se) or tellurium (Te), etc., may alternatively be used in place of silicon. In addition, the structure of the n-type cladding layer 30 may be a single layer structure or may be a multilayer structure.

The active layer 40 is a layer including a multiple quantum well structure (the quantum well structure) in which three barrier layers 41 and three well layers 42 are alternately stacked so that the barrier layer 41 is located on the n-type cladding layer 30-side and the well layer 42 is located on the multilayered semiconductor layer 50-side. The active layer 40 generates light at a predetermined wavelength by combining electrons with holes in the multiple quantum well structure. In the present embodiment, the active layer 40 is configured to have a band gap of not less than 3.4 eV to output deep ultraviolet light at a wavelength of not more than 365 nm, and ultraviolet light at a central wavelength of not less than 200 nm and not more than 365 nm is generated due to the multiple quantum well structure. In this regard, the numbers of the barrier layers 41 and the well layers 42 are not limited to three each, and may be two each or not less than four each. Alternatively, the structure may be a single quantum well structure in which one barrier layer 41 and one well layer 42 are provided.

As each barrier layer 41, it is possible to use an undoped $Al_qGa_{1-q}N$ (0<q≤1) layer. In the present embodiment, an Al composition ratio of AlGaN constituting each barrier layer 41 is not less than 50% (q≥0.5), preferably not less than 60% and not more than 90% (0.6≤q≤0.9). In addition, each barrier layer 41 has a thickness of not less than 2 nm and not more than 50 nm, preferably a thickness of not less than 5 nm and not more than 20 nm. Each barrier layer 41 may alternatively be a layer containing an n-type impurity or a p-type impurity.

As each well layer 42, it is possible to use an undoped $Al_rGa_{1-r}N$ (0≤r<1) layer. The Al composition ratio of AlGaN constituting each well layer 42 is not less than 30% and not more than 40% (0.3≤r≤0.4). In addition, each well layer 42 has a thickness of not less than 2 nm and not more than 3.5 nm. When the multiple quantum well structure is used as the quantum well structure of the active layer 40 as in the present embodiment, each well layer 42 except the well layer 42 in contact with the multilayered semiconductor layer 50 and each barrier layer 41 may include an n-type impurity.

The multilayered semiconductor layer 50 includes an electron blocking layer 51 formed on the active layer 40, a dislocation suppression structure-containing layer 52 being formed on the electron blocking layer 51 and including a dislocation suppression structure 520 that bends a dislocation D (dislocation line) from the active layer 40 (see FIG. 5), a p-type cladding layer 53 formed on the dislocation suppression structure-containing layer 52, and a p-type contact layer 54 formed on the p-type cladding layer 53. That is, in the light-emitting element 1 of the present embodiment, the dislocation suppression structure-containing layer 52 is formed on the active layer 40 via the electron blocking layer 51 and the p-type contact layer 54 is formed on the dislocation suppression structure-containing layer 52 via the p-type cladding layer 53. The dislocation D here is a threading dislocation that penetrates plural layers formed in the light-emitting element 1. The dislocation suppression structure-containing layer 52 will be described later.

The electron blocking layer 51 is composed of a first electron blocking layer 51a on the active layer 40-side and a second electron blocking layer 51b on the dislocation suppression structure-containing layer 52-side. The electron blocking layer 51 serves to suppress overflow and entry of electrons into the p-type cladding layer 53.

As the first electron blocking layer 51a, it is possible to use a layer which is made of AlGaN with p-type conductivity (hereinafter, also simply referred to as "p-type AlGaN") and is an $Al_sGa_{1-s}N$ (0<s≤1) layer doped with magnesium (Mg) as a p-type impurity. In the present embodiment, a dopant concentration (a Mg concentration) in the first electron blocking layer 51a is not more than $5\times10^{19}$ [atoms/cm³]. In addition, the first electron blocking layer 51a has a thickness of not more than 30 nm, preferably a thickness of not less than 0.5 nm and not more than 5 nm, more preferably a thickness of not less than 1.5 nm and not more than 2.5 nm. An Al composition ratio of AlGaN constituting the first electron blocking layer 51a is preferably not less than 80% (s≥0.8).

As the second electron blocking layer 51b, it is possible to use a layer which is made of p-type AlGaN and is an $Al_tGa_{1-t}N$ (0<t<1) layer doped with magnesium as a p-type impurity. In the present embodiment, a dopant concentration (a Mg concentration) in the second electron blocking layer 51b is not less than $1×10^{18}$ [atoms/cm$^3$] and not more than $1×10^{20}$ [atoms/cm$^3$]. In addition, an Al composition ratio of AlGaN constituting the second electron blocking layer 51b is not less than 45% and not more than 90% (0.45≤t≤0.9) and is smaller than the Al composition ratio of the first electron blocking layer 51a and larger than an Al composition ratio of the p-type cladding layer 53 (v<t<s, u<t<s). The second electron blocking layer 51b has a thickness of not less than 5 nm and not more than 100 nm. In this regard, the thickness of the second electron blocking layer 51b is preferably smaller than a thickness of the p-type contact layer 54. The first electron blocking layer 51a and the second electron blocking layer 51b are not necessarily limited to p-type semiconductor layers and may be undoped semiconductor layers.

The p-type cladding layer 53 is composed of a first p-type cladding layer 53a on the dislocation suppression structure-containing layer 52-side and a second p-type cladding layer 53b on the p-type contact layer 54-side.

As the first p-type cladding layer 53a, it is possible to use a layer which is made of p-type AlGaN or p-type GaN and is an $Al_uGa_{1-u}N$ (0≤u≤1) layer doped with magnesium as a p-type impurity. In the present embodiment, a dopant concentration (a Mg concentration) in the first p-type cladding layer 53a is not less than $1×10^{18}$ [atoms/cm$^3$] and not more than $1×10^{20}$ [atoms/cm$^3$]. In addition, an Al composition ratio of AlGaN constituting the first p-type cladding layer 53a is not less than 55% and not more than 65% (0.55≤u≤0.65). The first p-type cladding layer 53a has a thickness of not less than 10 nm and not more than 100 nm, preferably not less than 55 nm and not more than 85 nm.

As the second p-type cladding layer 53b, it is possible to use a layer which is made of p-type AlGaN or p-type GaN and is an $Al_vGa_{1-v}N$ (0≤v≤1) layer doped with magnesium as a p-type impurity. In the present embodiment, a dopant concentration (a Mg concentration) in the second p-type cladding layer 53b is not less than $1×10^{18}$ [atoms/cm$^3$] and not more than $1×10^{20}$ [atoms/cm$^3$]. In addition, an Al composition ratio of AlGaN constituting the second p-type cladding layer 53b has a composition gradient that gradually decreases from 60% to 0%, from the first p-type cladding layer 53a-side to the p-type contact layer 54-side in a thickness direction. In addition, the second p-type cladding layer 53b has a thickness of not less than 2 nm and not more than 8 nm. By providing such a composition gradient, it is possible to suppress occurrence of the dislocation D due to a difference in the Al composition ratio between the p-type cladding layer 53 and the p-type contact layer 54.

As the p-type contact layer 54, it is possible to use a layer which is made of p-type AlGaN or p-type GaN and is an $Al_wGa_{1-w}N$ (0≤w≤1) layer doped with magnesium as a p-type impurity. In the present embodiment, a dopant concentration (a Mg concentration) in the p-type contact layer 54 is not less than $5×10^{18}$ [atoms/cm$^3$] and not more than $5×10^{20}$ [atoms/cm$^3$]. In addition, an Al composition ratio of AlGaN constituting the p-type contact layer 54 is not more than 10% (0≤w≤0.1), preferably 0% (w=0). The p-type contact layer 54 has a thickness of not less than 10 nm and not more than 30 nm, preferably not less than 15 nm and not more than 25 nm.

As the p-type impurity to dope the electron blocking layer 51, the p-type cladding layer 53 and the p-type contact layer 54, zinc (Zn), beryllium (Be), calcium (Ca), strontium (Sr), barium (Ba) or carbon (C), etc., may alternatively be used in place of magnesium.

The silicon dopant concentrations (the Si concentrations) in the electron blocking layer 51, the p-type cladding layer 53 and the p-type contact layer 54 are preferably not more than $5×10^{17}$ [atoms/cm$^3$], i.e., a background level of a measuring device.

The p-side electrode 60 is made of rhodium (Rh). The p-side electrode 60 is preferably made of a material with high UV reflectance.

The n-side electrode 70 is made of a multilayered film formed by sequentially stacking titanium (Ti), aluminum (Al), titanium and gold (Au) on the n-type cladding layer 30.

Figure 2:
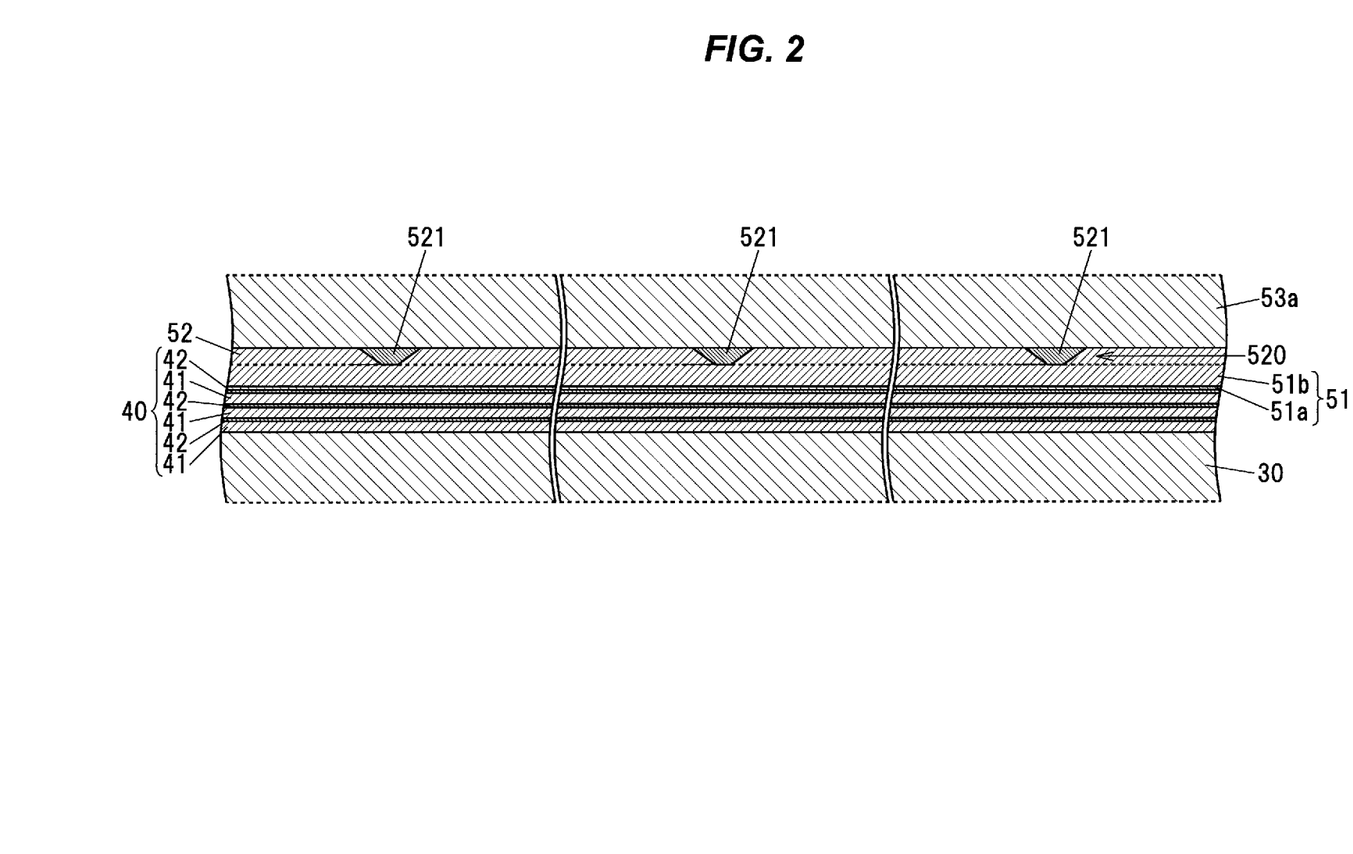
FIG. 2 is a cross sectional view showing a periphery of a dislocation suppression structure-containing layer.
Figure 3:
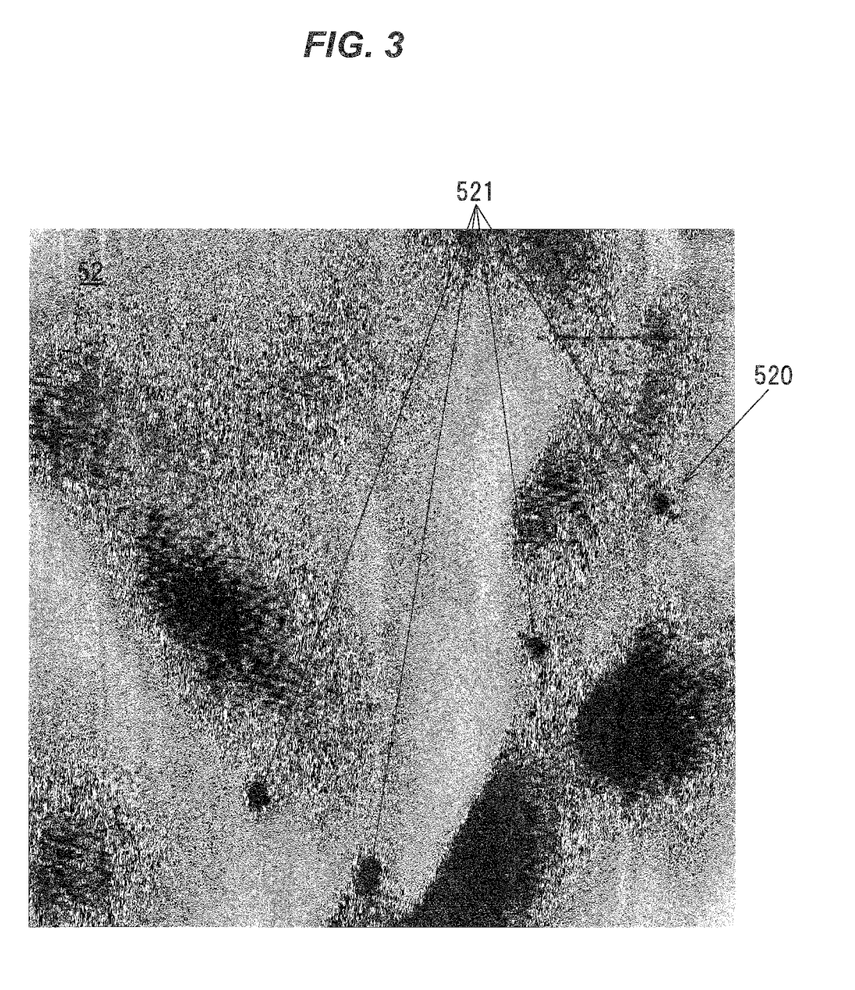
FIG. 3 is an AFM image showing a surface of the dislocation suppression structure-containing layer.
Figure 4A:
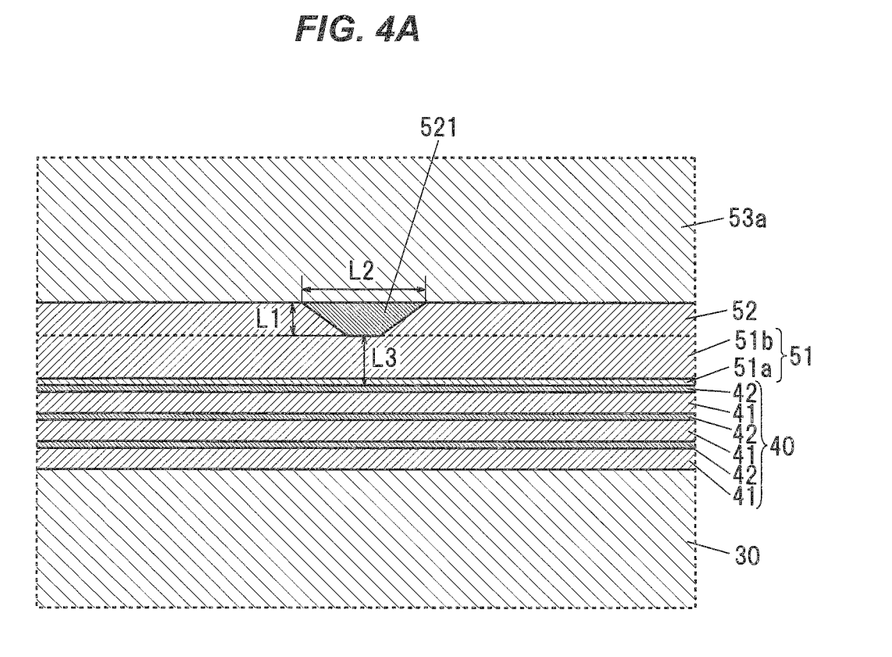
FIGS. 4A and 4B are a cross sectional view and a plan view that show a periphery of a dislocation suppression portion.
Figure 4B:
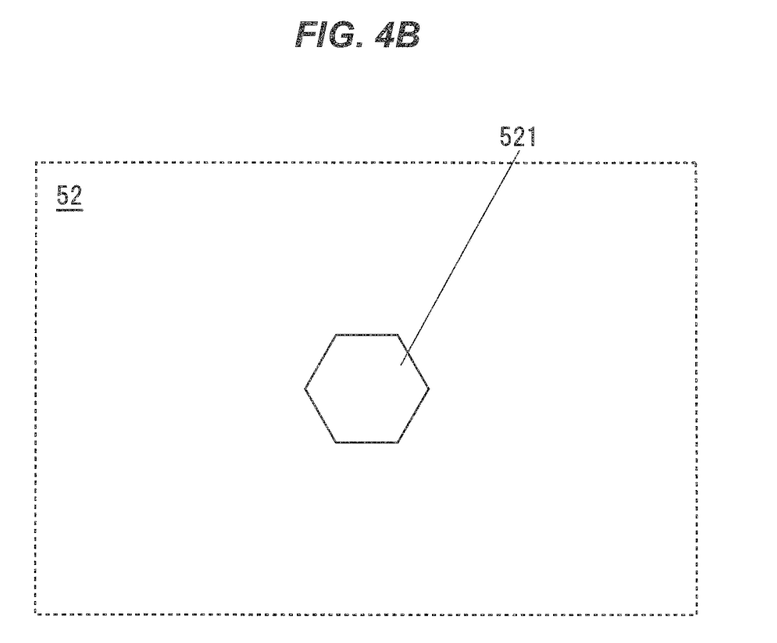

Next, the dislocation suppression structure-containing layer 52 will be described in reference to FIGS. 2 to 4. The dislocation suppression structure-containing layer 52 is mainly made of $Al_yGa_{1-y}N$ with an Al composition ratio of not less than 75% and not more than 85% (0.75≤y≤0.85) (that is, part other than dislocation suppression portions 521 described later is made of AlGaN with an Al composition ratio of not less than 75% and not more than 85%). The dislocation suppression structure-containing layer 52 includes the dislocation suppression structure 520 composed of plural dislocation suppression portions 521 that are scattered lengthwise and crosswise in directions orthogonal to the stacking direction, as shown in FIGS. 2 and 3. In this regard, FIG. 2 is a cross sectional view showing a periphery of the dislocation suppression structure-containing layer 52, and FIG. 3 is an AFM image (an image showing a result of surface observation by an atomic force microscope) showing a surface of the dislocation suppression structure-containing layer 52.

Each dislocation suppression portion 521 is composed of a V-pit. The V-pit in the present embodiment is a portion where a growth mode of a parent phase changed (such as acceleration of growth on a plane other than a c-plane) due to silicon doped into the parent phase or precipitation of a silicon-containing compound (SiN, etc.) in the parent phase. In particular, each dislocation suppression portion 521 has a trapezoidal cross-sectional shape which is tapered so that the narrow end is located on the active layer 40-side when viewed in a direction orthogonal to the stacking direction, as shown in FIG. 4A. In addition, each dislocation suppression portion 521 has a hexagonal planar shape when viewed in the stacking direction, as shown in FIG. 4B. That is, each dislocation suppression portion 521 is formed in a hexagonal frustum shape arranged so that the narrow end is located on the active layer 40-side. In addition, a height L1 of each dislocation suppression portion 521 in the stacking direction is not less than 5 nm and not more than 50 nm, preferably not less than 10 nm and not more than 30 nm. A width L2 of each dislocation suppression portion 521 in a direction orthogonal to the stacking direction is not less than 5 nm and not more than 200 nm. Furthermore, a separation distance L3 between each dislocation suppression portion 521 and the active layer 40 in the stacking direction (a distance in the stacking direction from an end face position of each dislocation suppression portion 521 on the active layer 40-side to an interface position between the multilayered semiconductor layer 50 and the active layer 40) is not less than 0 nm and not more than 100 nm, preferably not more than 50 nm, more preferably not more than 30 nm. Since a thickness of the dislocation suppression structure-containing layer 52 is determined by the height L1 of each dislocation suppression portion 521 in the stacking direction, the thickness of the dislocation suppression structure-containing layer 52 is not less than 5 nm and not more than 50 nm, preferably not less than 10 nm and not more than 30 nm.

Figure 5:
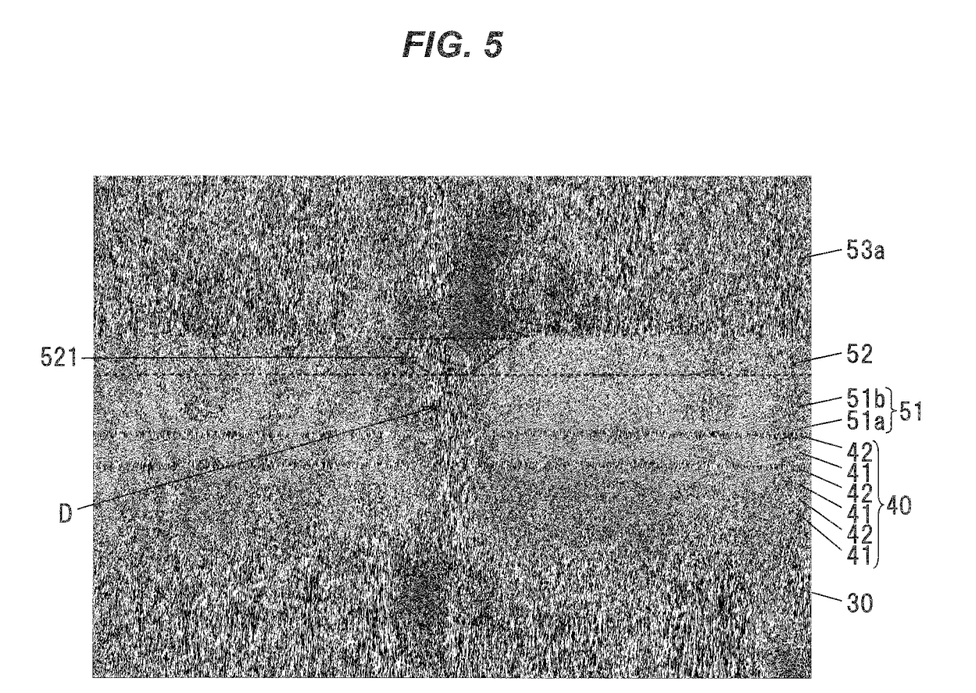
FIG. 5 is a TEM image showing a periphery of the dislocation suppression portion in a state in which a dislocation is generated, when viewed in a direction orthogonal to a stacking direction.

By providing such dislocation suppression portions 521, the dislocation D (dislocation line) from the active layer 40 can be bent (curved) sideways in the stacking direction at such dislocation suppression portions 521. It is thereby possible to suppress the phenomenon that dislocation D from the active layer 40 reaches the p-type contact layer 54 (particularly, a surface of the p-type contact layer 54). That is, generation of dislocation extending from the active layer 40 to the p-type contact layer 54 can be avoided. It is presumed that the reason why the dislocation D (dislocation line) from the active layer 40 is bent sideways in the stacking direction by each dislocation suppression portion 521 is that a propagating direction of the dislocation D changes due to the change in the growth mode of the parent phase at each dislocation suppression portion 521. Meanwhile, the dislocation D is generated due to a difference in lattice constant between adjacent two of the substrate 10 and the layers stacked on the substrate 10. Note that, FIG. 5 is a TEM image (an image taken by a transmission electron microscope) showing a periphery of the dislocation suppression structure-containing layer 52 in a state in which a dislocation is generated, when viewed in a direction orthogonal to a stacking direction.

Figure 6A:
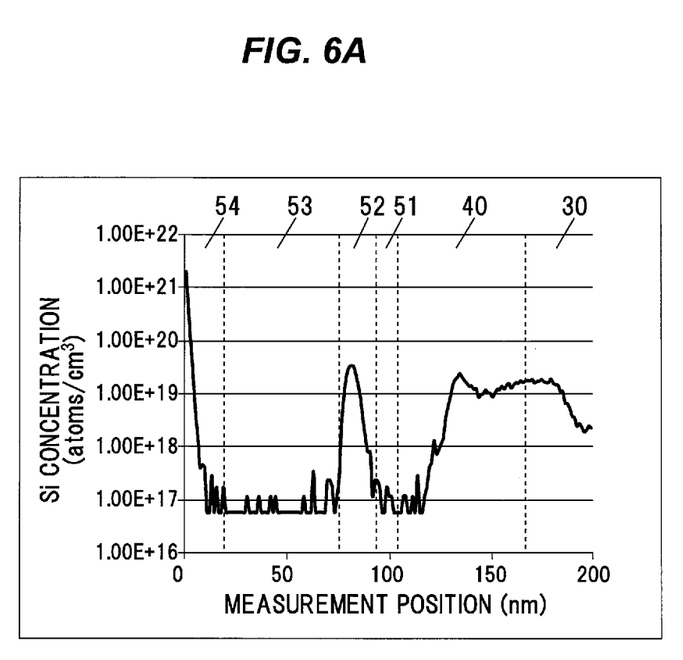
FIG. 6A is a graph showing a Si concentration distribution along the stacking direction.

Meanwhile, in a Si concentration distribution along the stacking direction in the dislocation suppression structure-containing layer 52, there is a concentration peak (a local maximum) that is higher than that in other parts of the dislocation suppression structure-containing layer 52, as shown in FIG. 6A. The Si concentration at this concentration peak is not less than $1\times10^{18}$ [atoms/cm$^3$] and not more than $1\times10^{20}$ [atoms/cm$^3$], preferably not less than $3\times10^{18}$ [atoms/cm$^3$] and not more than $5\times10^{19}$ [atoms/cm$^3$]. In the example shown in FIG. 6A, the Si concentration at the concentration peak is $3.41\times10^{19}$ [atoms/cm$^3$]. By having a Si concentration peak as described above, magnesium is attracted to the position of the concentration peak.

Figure 6B:
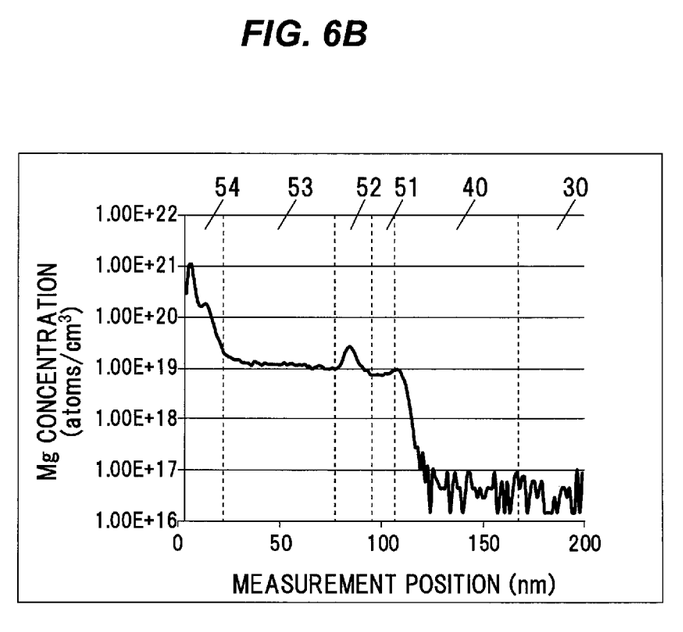
FIG. 6B is a graph showing an Mg concentration distribution along the stacking direction.

Furthermore, in an Mg concentration distribution along the stacking direction in the dislocation suppression structure-containing layer 52, there is a concentration peak (a local maximum) that is higher than that in other parts of the dislocation suppression structure-containing layer 52, as shown in FIG. 6B. The Mg concentration at this concentration peak is not less than $5\times10^{18}$ [atoms/cm$^3$] and not more than $5\times10^{20}$ [atoms/cm$^3$], preferably not less than $7\times10^{18}$ [atoms/cm$^3$] and not more than $5\times10^{19}$ [atoms/cm$^3$]. In the example shown in FIG. 6B, the Mg concentration at the concentration peak is $2.67\times10^{19}$ [atoms/cm$^3$].

The position of the Mg concentration peak and the position of the Si concentration peak are the same in the stacking direction. Strictly speaking, the position of the Mg concentration peak and the position of the Si concentration peak in the stacking direction may be not more than ±5 nm different from each other, but can be regarded as the same if within ±5 nm. It can be at least said that the position of the Mg concentration peak and the position of the Si concentration peak in the stacking direction can be regarded as substantially the same positions with not more than ±5 nm of difference. In the concentration distribution shown in each of FIGS. 6A and 6B, the position of the surface of the p-type contact layer 54 is shown as the starting point of the measurement position in the stacking direction (i.e., the measurement position=0), and a direction toward the substrate 10 is shown as a positive direction.

(Process of Manufacturing Light-Emitting Element)

Next, a process (method) of manufacturing the light-emitting element 1 will be described in reference to FIG. 7. The process of manufacturing the light-emitting element 1 is started in the state in which a wafer to be the substrate 10 is placed in a chamber.

Figure 7:
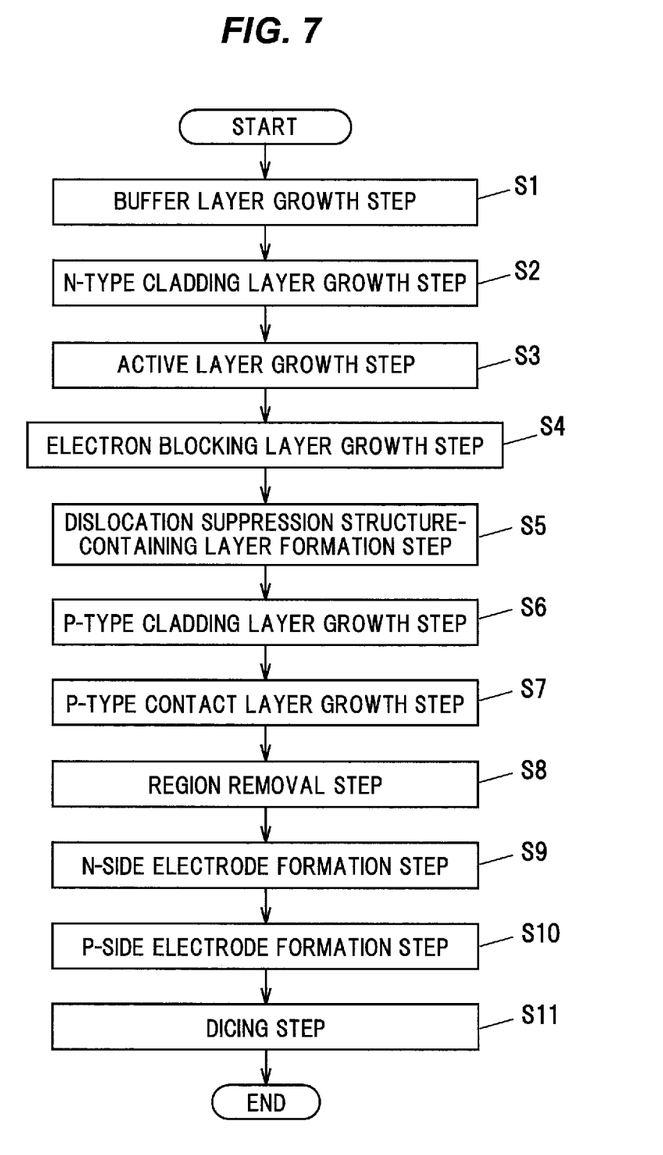
FIG. 7 is a flowchart showing a process of manufacturing the light-emitting element.

As shown in FIG. 7, a buffer layer growth step S1, an n-type cladding layer growth step S2, an active layer growth step S3, an electron blocking layer growth step S4, a dislocation suppression structure-containing layer formation step S5, a p-type cladding layer growth step S6, a p-type contact layer growth step S7, a region removal step S8, an n-side electrode formation step S9, a p-side electrode formation step S10 and a dicing step S11 are sequentially performed in the process of manufacturing the light-emitting element 1. For growth of each layer in each growth step, it is possible to use a well-known epitaxial growth method such as the Metal Organic Chemical Vapor Deposition (MOCVD) method, the Molecular Beam Epitaxy (MBE) method, or Hydride Vapor Phase Epitaxy (HVPE) method. Then, AlGaN, MN or GaN layers are grown by appropriately feeding trimethylaluminum (TMA) as an AL source, trimethylgallium (TMG) as a Ga source, and ammonia (NH$_3$) as an N source into the chamber. In addition, the Al composition ratio of each layer is controlled to have an intended value by adjusting the feeding amounts of these source gases.

In the buffer layer growth step S1, the buffer layer 20 is epitaxially grown by a high temperature growth at not less than 1,000° C. and not more than 1,400° C. on the wafer (on a surface of the wafer). In addition, in the buffer layer growth step S1, the buffer layer 20 is grown so that the buffer layer 20 has an Al composition ratio of 100% and a thickness of not less than 1,800 nm and not more than 2,200 nm.

In the n-type cladding layer growth step S2, the n-type cladding layer 30 is epitaxially grown under the temperature condition of not less than 1,020° C. and not more than 1,180° C. on the buffer layer 20 (on a surface of the buffer layer 20) grown in the buffer layer growth step S1. In addition, in the n-type cladding layer growth step S2, the n-type cladding layer 30 is grown so that the n-type cladding layer 30 has an Al composition ratio of not less than 50% and not more than 60% and a thickness of not less than 1,800 nm and not more than 2,200 nm.

In the active layer growth step S3, the active layer 40 is epitaxially grown under the temperature condition of not less than 1,000° C. and not more than 1,100° C. on the n-type cladding layer 30 (on a surface of the n-type cladding layer 30) grown in the n-type cladding layer growth step S2. In detail, three barrier layers 41 and three well layers 42, which constitute the active layer 40, are alternately epitaxially grown one by one. In addition, in the active layer growth step S3, each barrier layer 41 is grown so that the each barrier layer 41 has an Al composition ratio of not less than 50% (preferably not less than 60% and not more than 90%) and a thickness of not less than 2 nm and not more than 50 nm (preferably, not less than 5 nm and not more than 20 nm), and each well layer 42 is grown so that the each well layer 42 has an Al composition ratio of not less than 30% and not more than 40% and a thickness of not less than 2 nm and not more than 3.5 nm.

In the electron blocking layer growth step S4, the first electron blocking layer 51a and the second electron blocking layer 51b are epitaxially grown under the temperature condition of not less than 1,000° C. and not more than 1,100° C. on the active layer 40 (on a surface of the active layer 40) grown in the active layer growth step S3. The electron blocking layer 51 is thereby grown on the active layer 40. In addition, in the electron blocking layer growth step S4, the first electron blocking layer 51a is grown so that the first electron blocking layer 51a has an Al composition ratio of 80% (preferably, 100%) and a thickness of not more than 30 nm (preferably not less than 0.5 nm and not more than 5 nm, more preferably not less than 1.5 nm and not more than 2.5 nm), and the second electron blocking layer 51b is grown so that the second electron blocking layer 51b has an Al composition ratio of not less than 45% and not more than 90% and a thickness of not less than 10 nm and not more than 115 nm. In the present embodiment, since a part of the second electron blocking layer 51b becomes the dislocation suppression structure-containing layer 52, the second electron blocking layer 51b is grown so as to be thicker than the target thickness of the final second electron blocking layer 51b (not less than 5 nm and not more than 100 nm) by the thickness of the dislocation suppression structure-containing layer 52 (not less than 5 nm and not more than 15 nm).

In the dislocation suppression structure-containing layer formation step S5, tetramethylsilane (TMSi) and ammonia are fed into the chamber under the temperature condition of not less than 1,000° C. and not more than 1,100° C. and plural dislocation suppression portions 521 are formed on a upper surface side of the second electron blocking layer 51b. That is, when tetramethylsilane and ammonia are fed into the chamber under the temperature condition of not less than 1,000° C. and not more than 1,100° C., silicon is doped into the parent phase, or a silicon-containing compound (SiN, etc.) is precipitated in the parent phase, on the upper surface side of the second electron blocking layer 51b. As a result, the growth mode of the parent phase changes and plural dislocation suppression portions 521 are formed. Thus, the dislocation suppression structure 520 is formed on the upper surface side of the second electron blocking layer 51b and the dislocation suppression structure-containing layer 52 is formed in such a manner that a part of the second electron blocking layer 51b on the upper surface side becomes the dislocation suppression structure-containing layer 52. In addition, in the dislocation suppression structure-containing layer formation step S5, the dislocation suppression structure-containing layer 52 is formed so that the height L1 of each dislocation suppression portion 521 in the stacking direction is not less than 5 nm and not more than 50 nm (preferably not less than 10 nm and not more than 30 nm), the width L2 of each dislocation suppression portion 521 in a direction orthogonal to the stacking direction is not less than 5 nm and not more than 200 nm, and the separation distance L3 between each dislocation suppression portion 521 and the active layer 40 in the stacking direction is not less than 0 nm and not more than 100 nm (preferably not more than 50 nm, more preferably not more than 30 nm). Since the thickness of the dislocation suppression structure-containing layer 52 is determined by the height L1 of each dislocation suppression portion 521 in the stacking direction as described above, it can be described that, in the dislocation suppression structure-containing layer formation step S5, the dislocation suppression structure-containing layer 52 is formed so as to have a thickness of not less than 5 nm and not more than 50 nm (preferably not less than 10 nm and not more than 30 nm).

In the p-type cladding layer growth step S6, the first p-type cladding layer 53a and the second p-type cladding layer 53b are epitaxially grown under the temperature condition of not less than 1,000° C. and not more than 1,100° C. on the dislocation suppression structure-containing layer 52 (on a surface of the dislocation suppression structure-containing layer 52) grown in the dislocation suppression structure-containing layer formation step S5. The p-type cladding layer 53 is thereby grown on the dislocation suppression structure-containing layer 52. In addition, in the p-type cladding layer growth step S6, the first p-type cladding layer 53a is grown so that the first p-type cladding layer 53a has an Al composition ratio of not less than 55% and not more than 65% and a thickness of not less than 10 nm and not more than 100 nm (preferably not less than 55 nm and not more than 85 nm), and the second p-type cladding layer 53b is grown so that the second p-type cladding layer 53b has an Al composition ratio with a composition gradient from 60% to 0% and a thickness of not less than 2 nm and not more than 8 nm. The first p-type cladding layer 53a has a thickness of not less than 10 nm and not more than 100 nm, preferably a thickness of not less than 55 nm and not more than 85 nm.

In the p-type contact layer growth step S7, the p-type contact layer 54 is epitaxially grown under the temperature condition of not less than 900° C. and not more than 1,100° C. on the p-type cladding layer 53 (on a surface of the p-type cladding layer 53) grown in the p-type cladding layer growth step S6. In the p-type contact layer growth step S7, the p-type contact layer 54 is grown so that the p-type contact layer 54 has an Al composition ratio of not more than 10% (preferably 0%) and a thickness of not less than 10 nm and not more than 30 nm (preferably not less than 15 nm and not more than 25 nm).

In the region removal step S8, a mask is formed on the p-type contact layer 54 grown in the p-type contact layer growth step S7, and then, the unmasked region of each of the active layer 40, the electron blocking layer 51, the dislocation suppression structure-containing layer 52, the p-type cladding layer 53 and the p-type contact layer 54 is removed.

In the n-side electrode formation step S9, the n-side electrode 70 is formed on an exposed surface 30a of the n-type cladding layer 30 (see FIG. 1). In the p-side electrode formation step S10, the p-side electrode 60 is formed on the p-type contact layer 54 after removing the mask. The n-side electrode 70 and the p-side electrode 60 can be formed by, e.g., a well-known method such as electron beam evaporation method or sputtering method.

In the dicing step S11, the wafer (a stacked structure in which each layer and each electrode are formed on the wafer) is cut into pieces with a predetermined dimension. The light-emitting element 1 shown in FIG. 1 is thereby obtained.

EXAMPLE AND COMPARATIVE EXAMPLES

Next, Example of the light-emitting element 1 as a specific example of the above embodiment and First and Second Comparative Examples of the light-emitting element 1 as comparative examples not having the dislocation suppression structure-containing layer 52 will be described. Example and each Comparative Example are configured according to the above-described embodiment unless otherwise specified.

In Example, the thicknesses of the buffer layer 20, the n-type cladding layer 30, the barrier layer 41, the well layer 42, the first electron blocking layer 51a, the second electron blocking layer 51b, the dislocation suppression structure-containing layer 52, the first p-type cladding layer 53a, the second p-type cladding layer 53b and the p-type contact layer 54 were respectively set to 2,000 nm, 2,000 nm, 7 nm, 3 nm, 1.8 nm, 13.8 nm, 10 nm, 70 nm, 5 nm and 20 nm. In addition, each dislocation suppression portion 521 was formed so that the height L1 in the stacking direction was 13.3 nm, the width L2 in a direction orthogonal to the stacking direction was 42.2 nm, and the separation distance L3 between the active layer 40 and each dislocation suppression portion 521 was 15.6 nm.

In the configuration of First Comparative Example, the dislocation suppression structure-containing layer 52 and the p-type cladding layer 53 were omitted and the thickness of the p-type contact layer 54 was increased. In First Comparative Example, the thicknesses of the buffer layer 20, the n-type cladding layer 30, the barrier layer 41, the well layer 42, the first electron blocking layer 51a, the second electron blocking layer 51b and the p-type contact layer 54 were respectively set to 2,000 nm, 2,000 nm, 7 nm, 3 nm, 1.8 nm, 23.8 nm and 700 nm.

In the configuration of Second Comparative Example, the dislocation suppression structure-containing layer 52 and the second p-type cladding layer 53b were omitted. In Second Comparative Example, the thicknesses of the buffer layer 20, the n-type cladding layer 30, the barrier layer 41, the well layer 42, the first electron blocking layer 51a, the second electron blocking layer 51b, the first p-type cladding layer 53a and the p-type contact layer 54 were respectively set to 2,000 nm, 2,000 nm, 7 nm, 3 nm, 1.8 nm, 23.8 nm, 75 nm, and 20 nm.

(Measurement Results)

Figure 8:
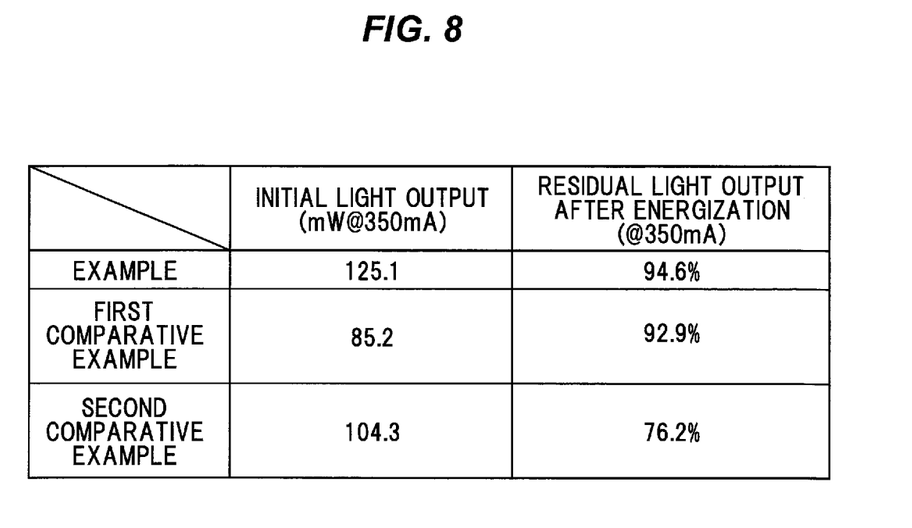
FIG. 8 is a table showing initial light output and residual light output after energization in Example and each Comparative Example.

When initial light output and residual light output after energization were measured in Example, First Comparative Example and Second Comparative Example, the results shown in the table of FIG. 8 were obtained. The initial light output in the measurement results is light output when applying a current of 350 mA in the state in which the element has not been used before, and the unit is mW (milliwatt). Meanwhile, the residual light output after energization in the measurement results is a percentage of light output after energizing for a long time and when applying a current of 350 mA as compared to the initial light output which is defined as 100%, and the unit is % (percent). In addition, in the measurement of the residual light output after energization, the long-time energization was 208 hours of energization in Example, 160 hours of energization in First Comparative Example, and 96 hours of energization in Second Comparative Example.

As shown in FIG. 8, a value of the initial light output in Example was significantly higher than that in First Comparative Example and was higher than that in Second Comparative Example. In addition, as shown in FIG. 8, a value of the residual light output after energization in Example was significantly higher than that in Second Comparative Example and was higher than that in First Comparative Example. This shows that, by reducing the thickness of the p-type contact layer 54 and providing the dislocation suppression structure-containing layer 52 between the p-type contact layer 54 and the active layer 40, it is possible to obtain light output equal to or higher than that obtained when simply reducing the thickness of the p-type contact layer 54 and it is possible to suppress a decrease in light output over time with energization time to the same extent or more than when simply increasing the thickness of the p-type contact layer 54.

Functions and Effects of the Embodiment

In the configuration of the embodiment described above, since the thickness of the p-type contact layer 54 is reduced and the dislocation suppression structure-containing layer 52 is provided between the p-type contact layer 54 and the active layer 40, it is possible to suppress the phenomenon that the dislocation D (threading dislocation, dislocation line) in the active layer 40 reaches the p-type contact layer 54 (mainly, the surface of the p-type contact layer 54) and prevent current concentration due to the dislocation D or entry of metal elements into the active layer 40, and it is thereby possible to suppress a decrease in light output over time with energization time (to improve reliability) and also improve light output. That is, when the thickness of the p-type contact layer 54 is increased to suppress the phenomenon that the dislocation D reaches the p-type contact layer 54, ultraviolet light is absorbed due to light absorption caused by the thick p-type contact layer 54 and light output decreases. However, in the configuration of the embodiment described above, even when the thickness of the p-type contact layer 54 is reduced, it is possible to suppress the phenomenon that the dislocation D from the active layer 40 reaches the p-type contact layer 54, hence, it is possible to suppress a decrease in light output over time with energization time. Therefore, it is possible to achieve both suppression of the decrease in light output over time and improvement in light output.

In addition, since a light scattering effect is produced by the dislocation suppression structure 520, it is possible to further improve light output. That is, since light returns toward the n-type cladding layer 30 without entering the p-type contact layer 54 by being scattered at the dislocation suppression structure 520, it is possible to further improve light output.

Modifications

Although the dislocation suppression structure 520 (the dislocation suppression portions 521) in the embodiment described above is configured to bend the dislocation D (dislocation line) from the active layer 40, the dislocation suppression structure 520 (the dislocation suppression portions 521) may be configured to stop the dislocation D (dislocation line) from the active layer 40.

In addition, although the dislocation suppression portion 521 in the embodiment described above has a trapezoidal cross-sectional shape with a narrow end on the active layer 40-side, the dislocation suppression portion 521 may have a triangular cross-sectional shape with an apex on the active layer 40-side when viewed in a direction orthogonal to the stacking direction. Furthermore, the dislocation suppression portion 521 may have a square cross-sectional shape, a circular cross-sectional shape, a semicircular cross-sectional shape, an elliptical cross-sectional shape, a semi-elliptical cross-sectional shape, a trapezoidal cross-sectional shape with a narrow end on the p-type contact layer 54-side, or a triangular cross-sectional shape with an apex on the p-type contact layer 54-side, etc., when viewed in a direction orthogonal to the stacking direction.

In addition, although the dislocation suppression portion 521 in the embodiment described above is formed by incorporating Si into the parent phase to change the growth mode or by causing precipitation of a silicon-containing compound (SiN, etc.) in the parent phase, the dislocation suppression portion 521 may be made of a polycrystalline semiconductor such as SiN, $SiN_2$, polycrystalline silicon or a polycrystalline nitride semiconductor, or the dislocation suppression portion 521 may be made of an oxide such as silicon oxide ($SiO_x$), titanium oxide ($TiO_x$) or zirconium oxide ($ZrO_x$). Furthermore, the dislocation suppression portion 521 may be made of a well-known nitride, etc., generally used as a so-called ELO (Epitaxial Lateral Overgrowth) mask, or the dislocation suppression portion 521 may be made of a high melting point metal such as titanium (Ti) or tungsten (W). Furthermore, the dislocation suppression portion 521 may be a multilayer film made of the materials listed here.

Furthermore, although the plural dislocation suppression portions 521 are formed by feeding tetramethylsilane and ammonia into the chamber under the temperature condition of not less than 1,000° C. and not more than 1,100° C. in the embodiment described above, a well-known vapor phase growth method such as vapor deposition, sputtering or VPE (Vapor Phase Epitaxy) may be used as the method of forming the plural dislocation suppression portions 521.

In addition, although the dislocation suppression structure-containing layer 52 in the embodiment described above is arranged between the electron blocking layer 51 and the p-type cladding layer 53, the dislocation suppression structure-containing layer 52 may be arranged at any position in the multilayered semiconductor layer 50 as long as the dislocation suppression structure-containing layer 52 is positioned between the active layer 40 and the p-type contact layer 54. For example, the dislocation suppression structure-containing layer 52 may be arranged between the active layer 40 and the electron blocking layer 51, or the dislocation suppression structure-containing layer 52 may be arranged between the p-type cladding layer 53 and the p-type contact layer 54. Furthermore, the dislocation suppression structure-containing layer 52 may be arranged between the first electron blocking layer 51a and the second electron blocking layer 51b, or between the first p-type cladding layer 53a and the second p-type cladding layer 53b.

Furthermore, although the multilayered semiconductor layer 50 in the embodiment described above has only one dislocation suppression structure-containing layer 52, the multilayered semiconductor layer 50 may have plural dislocation suppression structure-containing layers 52. Also in such a case, each of the plural dislocation suppression structure-containing layers 52 may be located at any position in the multilayered semiconductor layer 50. For example, the multilayered semiconductor layer 50 may have two dislocation suppression structure-containing layers 52, one of which is a first layer arranged between the electron blocking layer 51 and the p-type cladding layer 53 and other is a second layer arranged between the p-type cladding layer 53 and the p-type contact layer 54. Alternatively, for example, the multilayered semiconductor layer 50 may have two dislocation suppression structure-containing layers 52, one of which is a first layer arranged between the active layer 40 and the electron blocking layer 51 and other is a second layer arranged between the electron blocking layer 51 and the p-type cladding layer 53.

Furthermore, although the multilayered semiconductor layer 50 in the embodiment described above has the electron blocking layer 51, the dislocation suppression structure-containing layer 52, the p-type cladding layer 53 and the p-type contact layer 54, the electron blocking layer 51 may be omitted in the multilayered semiconductor layer 50 or the p-type cladding layer 53 may be omitted in the multilayered semiconductor layer 50. Furthermore, both the electron blocking layer 51 and the p-type cladding layer 53 may be omitted in the multilayered semiconductor layer 50.

In addition, although the electron blocking layer 51 in the embodiment described above has a two-layer structure composed of the first electron blocking layer 51a with a high Al composition ratio and the second electron blocking layer 51b with a low Al composition ratio, the electron blocking layer 51 may have a single layer structure composed of only one layer.

Furthermore, although the p-type cladding layer 53 in the embodiment described above has a two-layer structure composed of the first p-type cladding layer 53a with a constant Al composition ratio and the second p-type cladding layer 53b with a gradient Al composition ratio, the p-type cladding layer 53 may have a single layer structure composed of only one layer.

In the embodiment described above, the active layer 40 may have a dislocation suppression structure composed of plural dislocation suppression portions (e.g., V-pits) scattered lengthwise and crosswise in directions orthogonal to the stacking direction. In such a case, the position of each dislocation suppression portion in the dislocation suppression structure of the active layer 40 preferably coincides with the position of each dislocation suppression portion 521 in the dislocation suppression structure 520 of the dislocation suppression structure-containing layer 52 in the planer view.

Summary of the Embodiment

Technical ideas understood from the embodiment will be described below citing the reference numerals, etc., used for the embodiment. However, each reference numeral, etc., described below is not intended to limit the constituent elements in the claims to the members, etc., specifically described in the embodiment.

[1] A nitride semiconductor light-emitting element (1) that outputs ultraviolet light, the nitride semiconductor light-emitting element (1) comprising: an active layer (40) comprising a quantum well structure that generates the ultraviolet light; a dislocation suppression structure-containing layer (52) being formed on the active layer (40) and comprising a dislocation suppression structure (520) that stops or bends a dislocation (D) from the active layer (40); and a p-type contact layer (54) being formed on the dislocation suppression structure-containing layer (52) and having a thickness of not less than 10 nm and not more than 30 nm.

[2] The nitride semiconductor light-emitting element (1) described in [1], wherein the dislocation suppression structure (520) comprises a plurality of dislocation suppression portions (521) that are scattered lengthwise and crosswise in directions orthogonal to a stacking direction.

[3] The nitride semiconductor light-emitting element (1) described in [2], wherein each of the plurality of dislocation suppression portions (521) comprises a V-pit.

[4] The nitride semiconductor light-emitting element (1) described in [2] or [3], wherein each of the plurality of dislocation suppression portions (521) has a trapezoidal cross-sectional shape with a narrow end on the active layer (40)-side, or a triangular cross-sectional shape with an apex on the active layer (40)-side, when viewed in a direction orthogonal to the stacking direction.

[5] The nitride semiconductor light-emitting element (1) described in any one of [2] to [4], wherein a height (L1) of each of the plurality of dislocation suppression portions (521) in the stacking direction is not less than 5 nm and not more than 50 nm.

[6] The nitride semiconductor light-emitting element (1) described in any one of [2] to [5], wherein a width (L2) of each of the plurality of dislocation suppression portions (521) in a direction orthogonal to the stacking direction is not less than 5 nm and not more than 200 nm.

[7] The nitride semiconductor light-emitting element (1) described in any one of [2] to [6], wherein a separation distance (L3) between the each dislocation suppression portion (521) and the active layer (40) in the stacking direction is not less than 0 nm and not more than 100 nm.

REFERENCE SIGNS LIST

1 Light-emitting element
40 Active layer
52 Dislocation suppression structure-containing layer
54 P-type contact layer
520 Dislocation suppression structure
521 Dislocation suppression portion
D Dislocation
L1 Height in stacking direction
L2 Width in direction orthogonal to stacking direction
L3 Separation distance between Dislocation suppression portion and Active layer

What is claimed is:

1. A nitride semiconductor light-emitting element that outputs ultraviolet light, the nitride semiconductor light-emitting element comprising:
    an active layer comprising a quantum well structure that generates the ultraviolet light;
    a dislocation suppression structure-containing layer being formed on the active layer and comprising a dislocation suppression structure that stops or bends a dislocation from the active layer; and
    a p-type contact layer being formed on the dislocation suppression structure-containing layer and having a thickness of not less than 10 nm and not more than 30 nm;
    wherein the dislocation suppression structure comprises a silicon-containing compound.

2. The nitride semiconductor light-emitting element according to claim 1, wherein the dislocation suppression structure comprises a plurality of dislocation suppression portions that are scattered lengthwise and crosswise in directions orthogonal to a stacking direction.

3. The nitride semiconductor light-emitting element according to claim 2, wherein each of the plurality of dislocation suppression portions comprises a V-pit.

4. The nitride semiconductor light-emitting element according to claim 2, wherein each of the plurality of dislocation suppression portions has a trapezoidal cross-sectional shape with a narrow end on the active layer-side, or a triangular cross-sectional shape with an apex on the active layer-side, when viewed in a direction orthogonal to the stacking direction.

5. The nitride semiconductor light-emitting element according to claim 2, wherein a height of each of the plurality of dislocation suppression portions in the stacking direction is not less than 5 nm and not more than 50 nm.

6. The nitride semiconductor light-emitting element according to claim 2, wherein a width of each of the plurality of dislocation suppression portions in a direction orthogonal to the stacking direction is not less than 5 nm and not more than 200 nm.

7. The nitride semiconductor light-emitting element according to claim 2, wherein a separation distance between each of the plurality of dislocation suppression portions and the active layer in the stacking direction is not less than 0 nm and not more than 100 nm.

8. The nitride semiconductor light-emitting element according to claim 1, wherein the dislocation suppression structure is formed away from the active layer.

9. The nitride semiconductor light-emitting element according to claim 1, wherein in a Si concentration distribution along the stacking direction in the dislocation suppression structure-containing layer, there is a concentration peak that is higher than that in other parts of the dislocation suppression structure-containing layer, wherein the Si concentration at the concentration peak is not less than $1\times10^{18}$ [atoms/cm3] and not more than $1\times10^{20}$ [atoms/cm$^3$].

10. The nitride semiconductor light-emitting element according to claim 9,
    wherein in an Mg concentration distribution along the stacking direction in the dislocation suppression structure-containing layer, there is a concentration peak that is higher than that in other parts of the dislocation suppression structure-containing layer, wherein the Mg concentration at the concentration peak is not less than $5\times10^{18}$ [atoms/cm$^3$] and not more than $5\times10^{20}$ [atoms/cm$^3$].

* * * * *